US012615733B2

(12) United States Patent　　　　　(10) Patent No.:　US 12,615,733 B2
Trotman et al.　　　　　　　　　　　　(45) Date of Patent:　*Apr. 28, 2026

(54) DEBRIS-RESISTANT COOLING PATH

(71) Applicant: Hamilton Sundstrand Corporation, Charlotte, NC (US)

(72) Inventors: Alexander Trotman, South Windsor, CT (US); Kenneth J. Trotman, Granby, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 202 days.

This patent is subject to a terminal disclaimer.

(21) Appl. No.: 17/821,557

(22) Filed: Aug. 23, 2022

(65) Prior Publication Data

US 2024/0074089 A1　　Feb. 29, 2024

(51) Int. Cl.
*H05K 7/20* (2006.01)

(52) U.S. Cl.
CPC ................................ *H05K 7/20145* (2013.01)

(58) Field of Classification Search
CPC .......... H05K 7/20736; H05K 7/20745; H05K 7/20836; H05K 7/20145; H05K 7/20754; H05K 7/20727; H05K 7/20572; H05K 7/2079; H05K 7/20172; H05K 7/20781; H05K 7/20709; H05K 7/20154; H05K 7/20; H05K 7/1488; H05K 5/0213; G06F 1/20; G06F 1/206; G06F 1/203; G06F 2200/201
See application file for complete search history.

(56) References Cited

U.S. PATENT DOCUMENTS

| | | | | |
|---|---|---|---|---|
| 6,643,130 | B1 * | 11/2003 | DeMarchis | ........ H05K 7/20181 |
| | | | | 361/695 |
| 7,238,104 | B1 * | 7/2007 | Greenslade | ............... G06F 1/20 |
| | | | | 361/695 |
| 9,335,105 | B2 | 5/2016 | Koivuluoma et al. | |
| 11,660,573 | B2 * | 5/2023 | Curran | ............... H05K 7/20181 |
| | | | | 55/493 |
| 2006/0243423 | A1 | 11/2006 | Giacoma | |
| 2011/0116234 | A1 * | 5/2011 | Ye | ...................... H05K 7/20172 |
| | | | | 454/236 |
| 2020/0206694 | A1 | 7/2020 | Curran et al. | |

OTHER PUBLICATIONS

European Search Report for European Application No. 23191959.8; dated Jan. 24, 2024; 40 pages.

* cited by examiner

*Primary Examiner* — Mandeep S Buttar
(74) *Attorney, Agent, or Firm* — CANTOR COLBURN LLP

(57) ABSTRACT

An electronic assembly includes one or more electronic components and an enclosure in which the one or more electronic components are located. The enclosure includes a vertically top surface, a vertically bottom surface, and a plurality of side portions extending between the top surface and the bottom surface. A cooling arrangement for thermal management of the one or more electronic components includes a cooling airflow inlet to admit a cooling airflow into the enclosure, a cooling airflow outlet to exhaust the cooling airflow from the enclosure, and one or more cooling pathways between the cooling airflow inlet and the cooling airflow outlet. The cooling airflow outlet is downward facing toward the vertically bottom surface such that the cooling airflow flows out of the cooling airflow outlet a downward direction toward the vertically bottom surface.

18 Claims, 9 Drawing Sheets

DEBRIS-RESISTANT COOLING PATH

BACKGROUND

Exemplary embodiments pertain to the art of electronic enclosures, and more particularly to cooling of electronic assemblies located inside of electronic enclosures.

Electronic assemblies are utilized in numerous applications, such as communications, aircraft, and other transportation applications. The electronics industry is pursuing increased functionality of electronic assemblies in harsh environments, such as those having blowing sand or dust, and driving water or rain. Operation in these harsh environments, together with high power density and/or high ambient temperatures, makes thermal management of the electronic assemblies challenging. Such cooling may be provided by forced cooling air, but such a cooling scheme would typically result in the sand or rain entering the electronic assembly.

BRIEF DESCRIPTION

In one embodiment, an electronic assembly includes one or more electronic components and an enclosure in which the one or more electronic components are located. The enclosure includes a vertically top surface, a vertically bottom surface, and a plurality of side portions extending between the top surface and the bottom surface. A cooling arrangement for thermal management of the one or more electronic components includes a cooling airflow inlet to admit a cooling airflow into the enclosure, a cooling airflow outlet to exhaust the cooling airflow from the enclosure, and one or more cooling pathways between the cooling airflow inlet and the cooling airflow outlet. The cooling airflow outlet is downward facing toward the vertically bottom surface such that the cooling airflow flows out of the cooling airflow outlet a downward direction toward the vertically bottom surface.

Additionally or alternatively, in this or other embodiments a fan is located at the cooling airflow outlet to urge the airflow through the cooling arrangement.

Additionally or alternatively, in this or other embodiments the fan is positioned in an outlet duct.

Additionally or alternatively, in this or other embodiments the fan rotates about a fan axis arranged parallel to the downward direction.

Additionally or alternatively, in this or other embodiments an outlet plenum is located at the cooling airflow outlet upstream of the fan.

Additionally or alternatively, in this or other embodiments one of a grate or screen is located at the cooling airflow outlet.

Additionally or alternatively, in this or other embodiments the cooling airflow inlet is downward facing toward the vertically bottom surface such that the cooling airflow flows into the cooling airflow inlet an upward direction toward the vertically top surface.

Additionally or alternatively, in this or other embodiments the cooling airflow inlet is located at a side portion of the plurality of side portions.

Additionally or alternatively, in this or other embodiments the cooling airflow inlet is one or more of rectangular, circular, oval, or other geometric shape.

Additionally or alternatively, in this or other embodiments the cooling airflow outlet is configured as a drainage path for the electronic assembly.

In another embodiment, an electronic enclosure includes a vertically top surface, a vertically bottom surface, and a plurality of side portions extending between the top surface and the bottom surface. A cooling airflow inlet admits a cooling airflow into the enclosure, and a cooling airflow outlet exhausts the cooling airflow from the enclosure. The cooling airflow outlet is downward facing toward the vertically bottom surface such that the cooling airflow flows out of the cooling airflow outlet a downward direction toward the vertically bottom surface.

Additionally or alternatively, in this or other embodiments a fan is located at the cooling airflow outlet to urge the airflow through the cooling arrangement.

Additionally or alternatively, in this or other embodiments the fan is positioned in an outlet duct.

Additionally or alternatively, in this or other embodiments the fan rotates about a fan axis arranged parallel to the downward direction.

Additionally or alternatively, in this or other embodiments an outlet plenum is located at the cooling airflow outlet upstream of the fan.

Additionally or alternatively, in this or other embodiments one of a grate or screen is located at the cooling airflow outlet.

Additionally or alternatively, in this or other embodiments the cooling airflow inlet is downward facing toward the vertically bottom surface such that the cooling airflow flows into the cooling airflow inlet an upward direction toward the vertically top surface.

Additionally or alternatively, in this or other embodiments the cooling airflow inlet is located at a side portion of the plurality of side portions.

Additionally or alternatively, in this or other embodiments the cooling airflow inlet is one or more of rectangular, circular, oval, or other geometric shape.

Additionally or alternatively, in this or other embodiments the cooling airflow outlet is configured as a drainage path for the electronic assembly.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
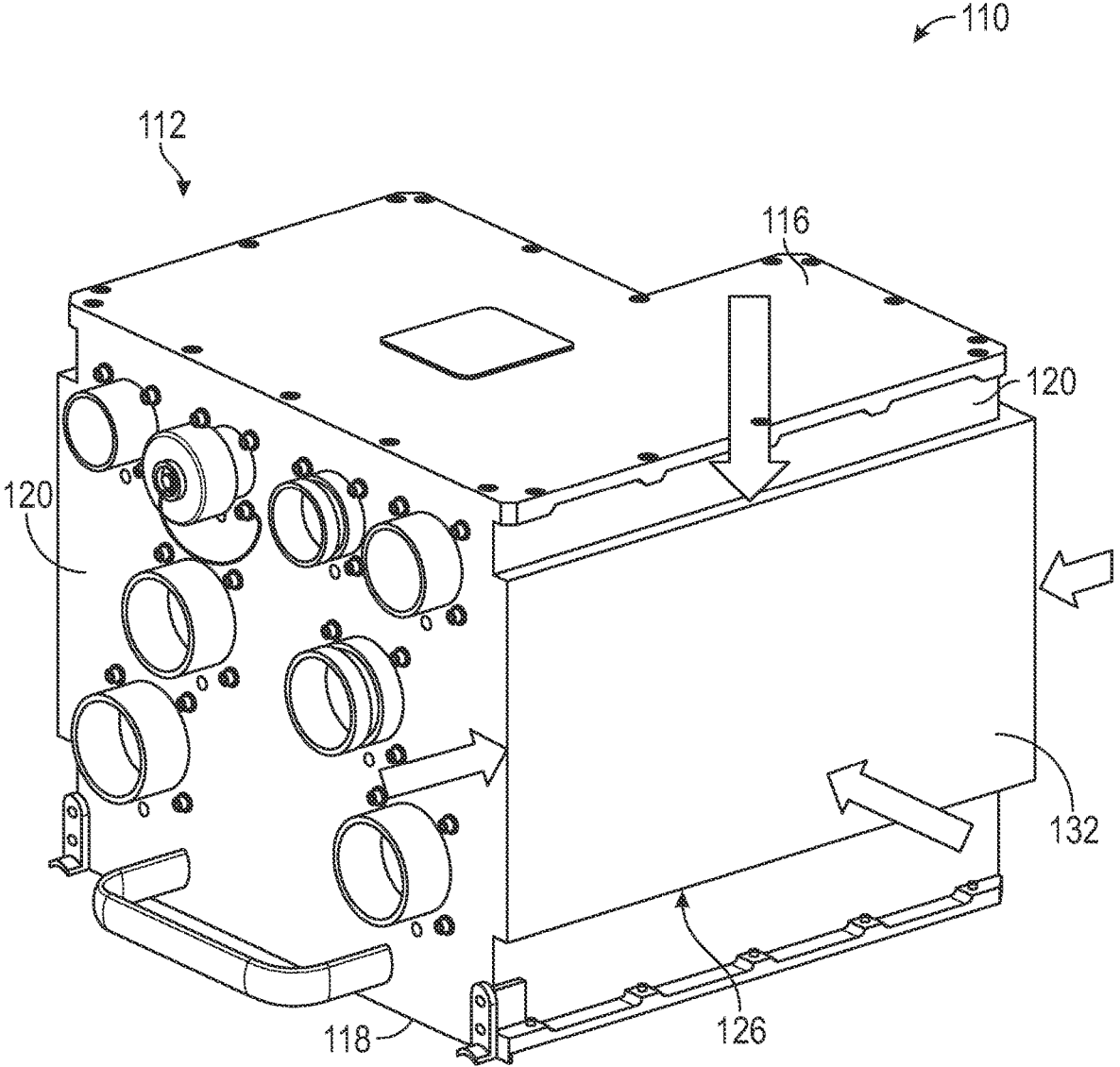
FIG. 1 is a perspective view of an embodiment of an electronic assembly.
Figure 2:
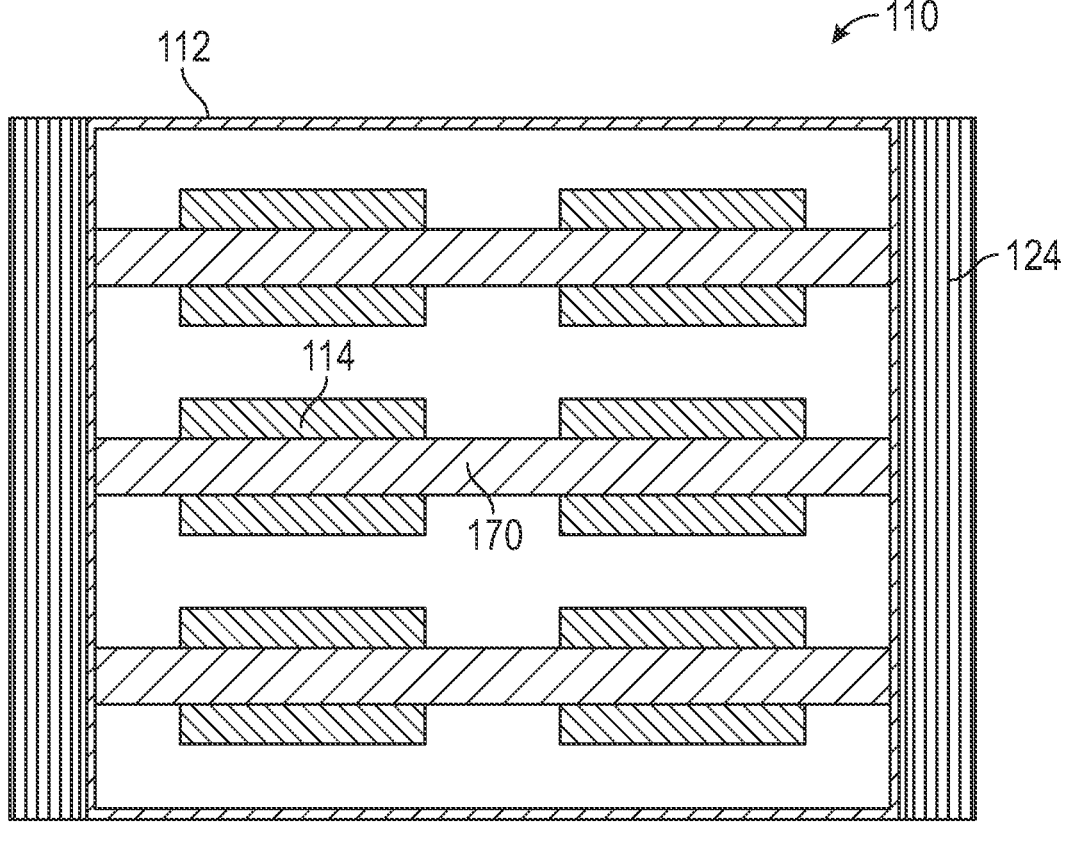
FIG. 2 is a cross-sectional view of an embodiment of an electronic assembly.

A detailed description of one or more embodiments of the disclosed apparatus and method are presented herein by way of exemplification and not limitation with reference to the Figures.

Referring to FIGS. 1-4, illustrated is an embodiment of an electronic assembly 110. The electronic assembly 110 includes an enclosure 112 and one or more electronic components 114 contained inside of the enclosure 112, and secured to a printed circuit board 170 as shown in the cross-sectional view of FIG. 2. The enclosure 112 includes a vertically top surface 116 and a vertically bottom surface 118, with a plurality of side portions 120 extending between the vertically top surface 116 and the vertically bottom surface 118 to define the enclosure 112. The enclosure 112 may be formed from, for example a metal material or a polymer material, or in some embodiments a combination thereof.

Figure 4:
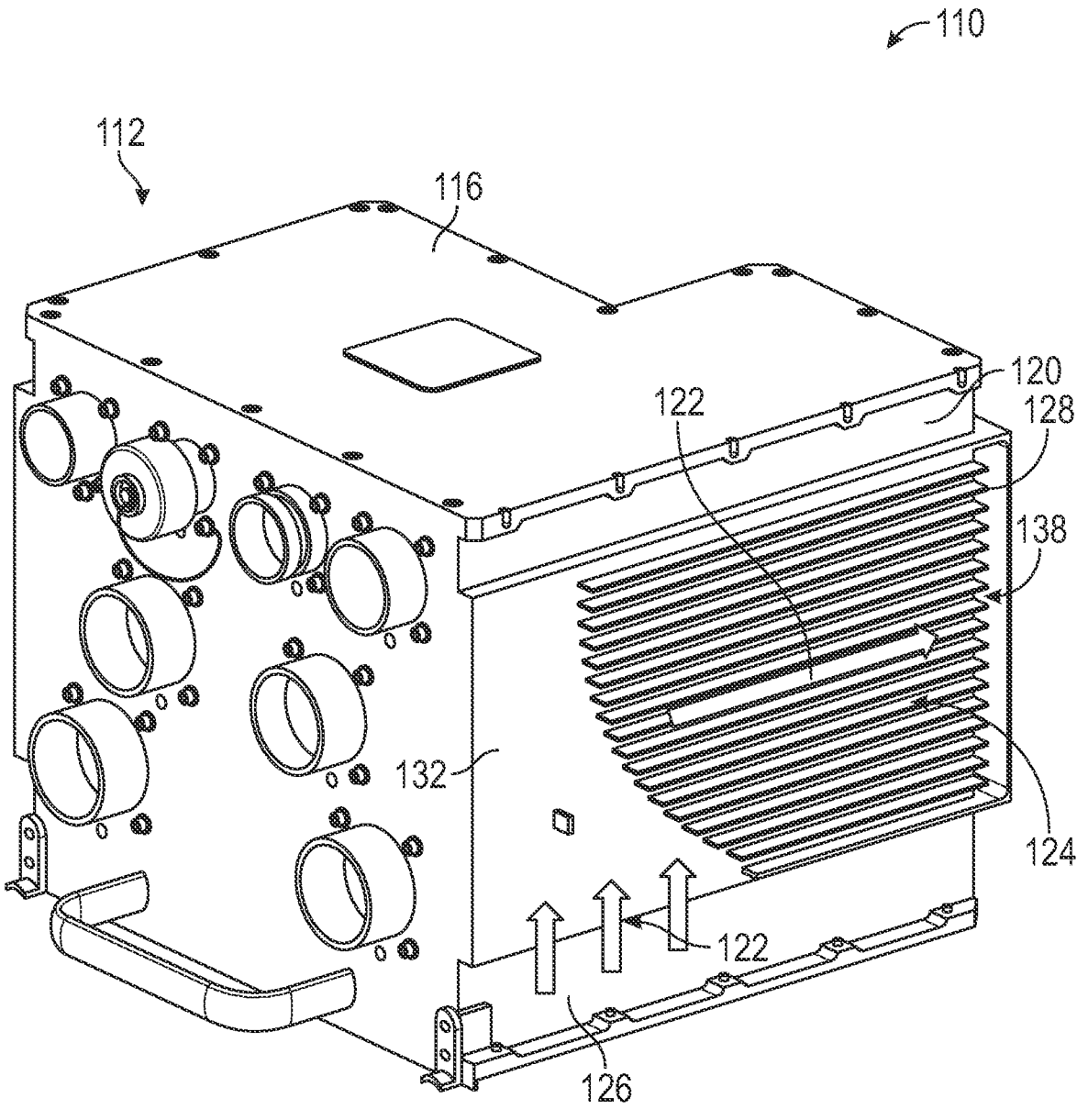
FIG. 4 is a partial cross-sectional view of an embodiment of an electronic assembly, including airflow cooling pathways.

Referring to the partial cross-section of FIG. 4, an airflow 122 through one or more cooling pathways 124 inside the enclosure 112 is utilized to remove thermal energy from the one or more electronic components 114 (shown in FIG. 2) disposed in the enclosure 112. The airflow 122 is admitted to the enclosure 112 via one or more airflow inlets 126 and flows through the cooling pathways 124, and exits the enclosure 112 via one or more airflow outlets 128. In some embodiments, a fan (not shown) is utilized to urge the airflow 122 through the enclosure 112.

Figure 3:
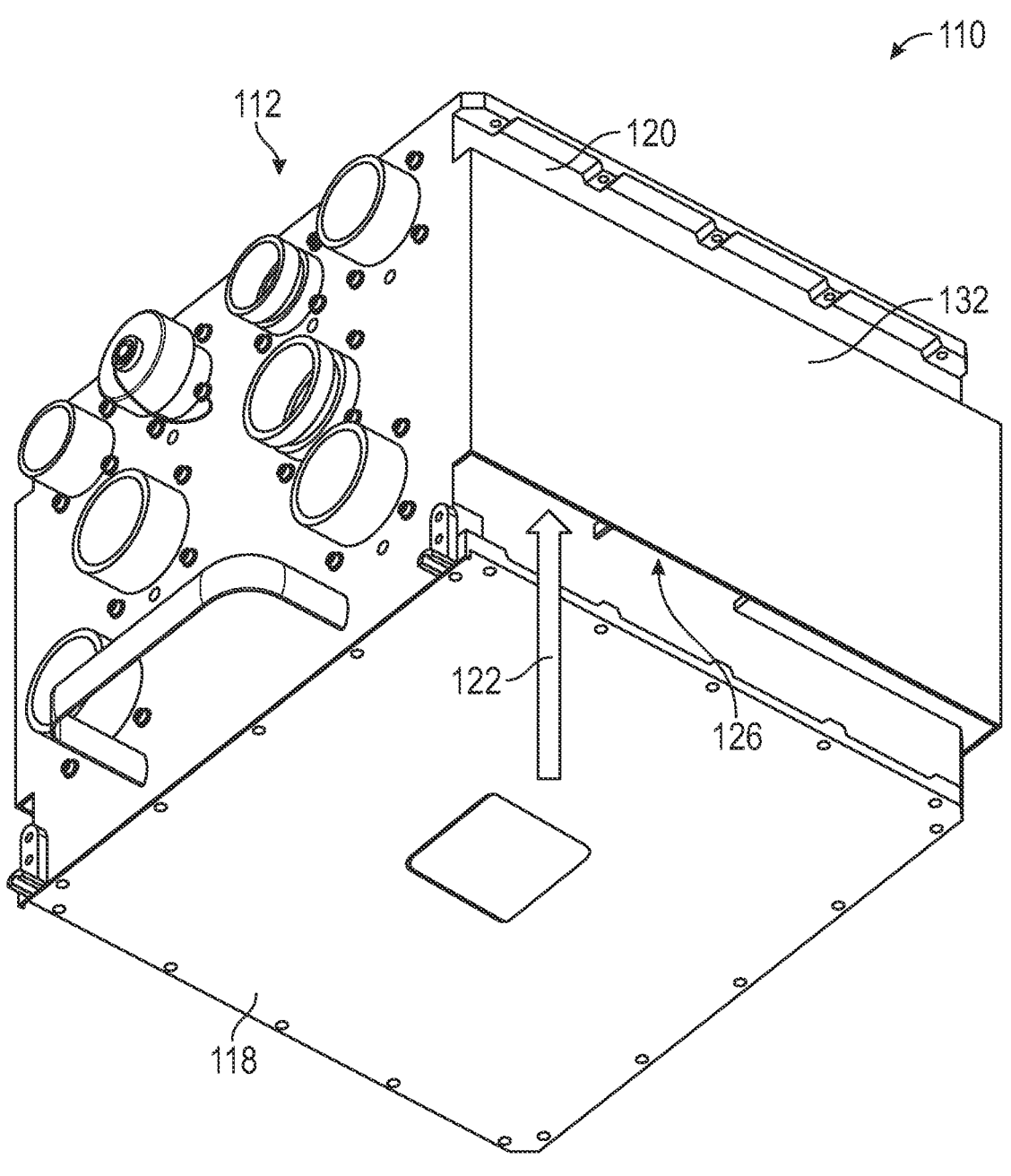
FIG. 3 is another perspective view of an embodiment of an electronic assembly, including an airflow inlet.

As shown best in FIG. 3, the airflow inlets 126 are positioned and configured to prevent direct impingement of debris such as sand, dust, water or the like into the airflow inlets 126. In particular, the airflow inlets 126 are located at the one or more side portions 120 of the enclosure 112. The one or more airflow inlets 126 face downward, meaning that the airflow 122 entering the airflow inlets 126 travels in a generally upward direction away from the bottom surface 118 and toward the top surface 116 when the airflow 122 enters the airflow inlets 126. In some embodiments, the airflow inlets 126 are defined in an inlet duct 132 protruding from the side portion 120. The airflow inlets 126 defined in the inlet duct 132 face toward the bottom surface 118. While in the embodiment of FIG. 3, the airflow inlets 126 are illustrated at one side portion 120 of the enclosure 112, one skilled in the art will readily appreciate that in other embodiments airflow inlets 126 may be positioned at two or more side portions 120 in order to provide a selected amount of airflow 122 to the interior of the enclosure 112 to remove thermal energy from the electronic components 114 (shown in FIG. 2) in the enclosure 112. Further, while the airflow inlets 126 illustrated in FIG. 3 are rectangular in shape, in other embodiments, the airflow inlets 126 may be, for example, circular, oval, or other geometric shape. A grate or screen (not shown) may be positioned at the airflow inlet 126 to aid in preventing the entry of debris into the interior of the enclosure 112. In addition to preventing impingement of debris into the airflow inlets 126, the downward facing airflow inlet 126 provides a drainage path out of the enclosure 112 for any water or other debris that may enter the cooling pathways of enclosure 112. Additionally the downward facing airflow inlet 126 eliminates the need for additional protection of the cooling pathways 124 (shown in FIG. 2), via filters or the like, thus reducing cost and weight and improving cooling performance.

Figure 5:
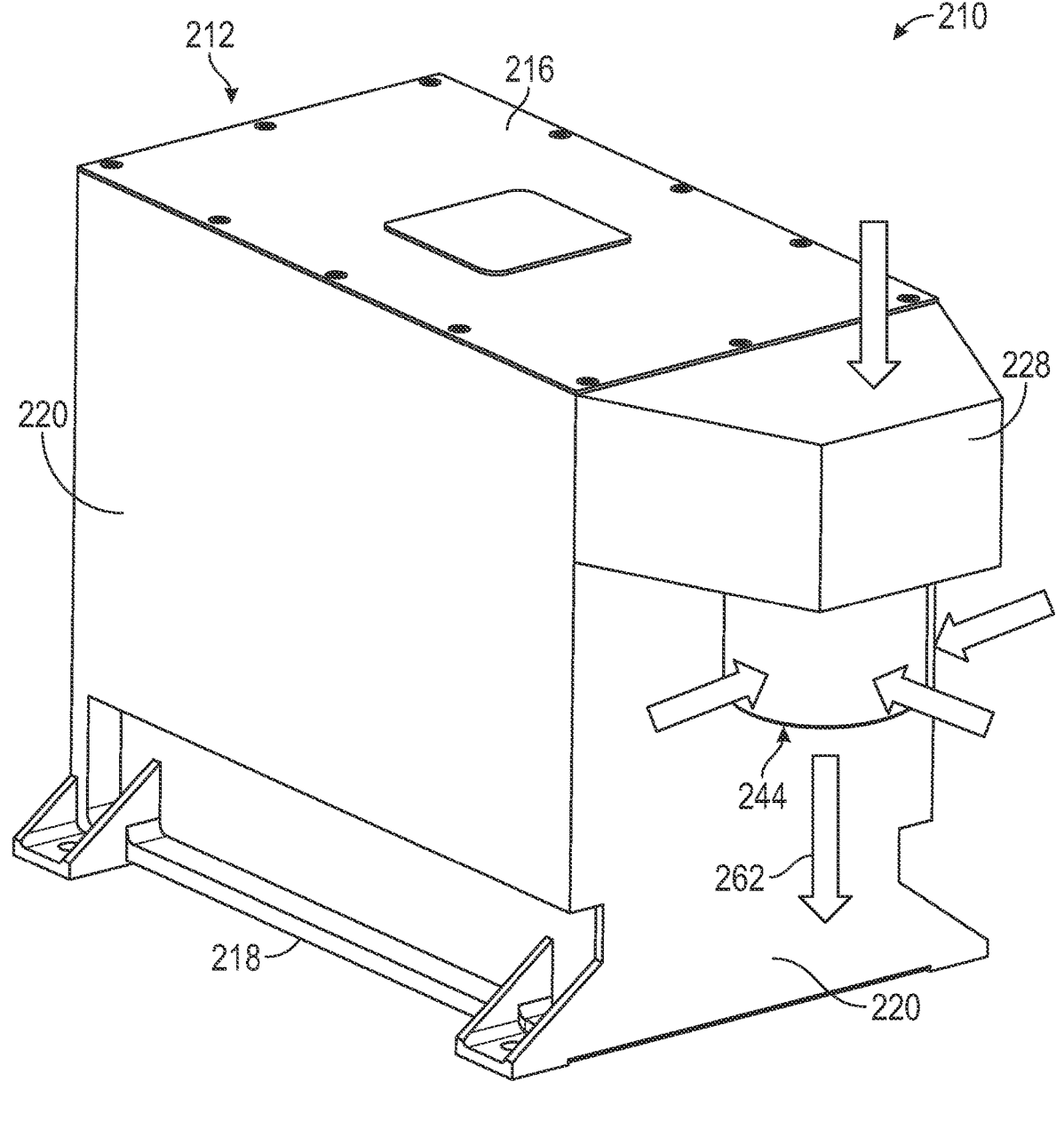
FIG. 5 is a perspective view of an embodiment of an electronic assembly including an airflow outlet.

Referring now to FIG. 5, illustrated is an exemplary airflow outlet 228 of the enclosure 212 of the electronic assembly 210. The airflow outlet 228 is located at a side portion 220 of the enclosure 212. The airflow outlet 228 is positioned and configured to face downward toward the bottom surface 218 of the enclosure 212, such that the exhaust airflow 262 leaving the enclosure 212 via the airflow outlet 228 proceeds downwardly out of the airflow outlet 228 in a direction away from the top surface 216 and toward the bottom surface 218.

Figure 6:
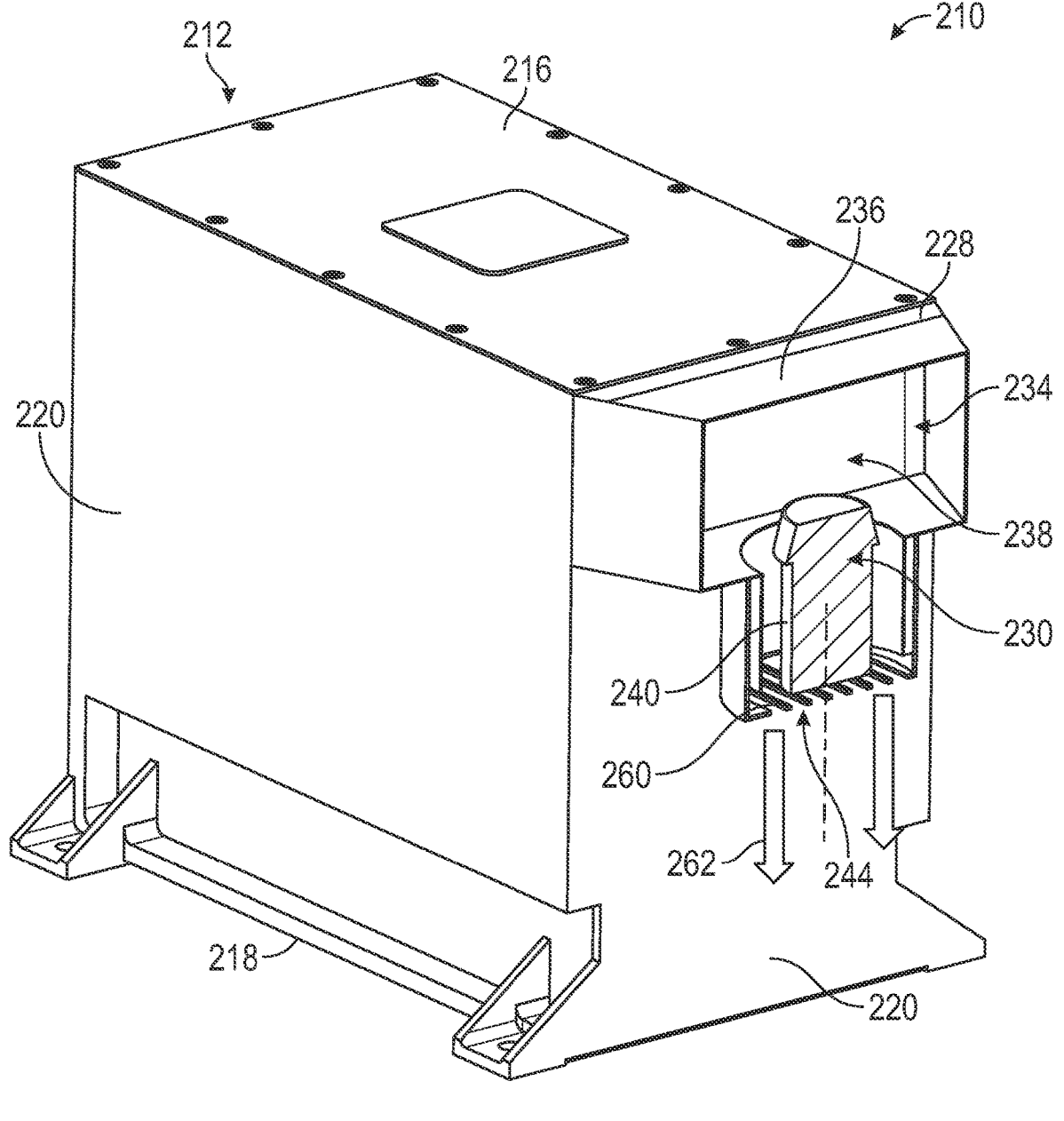
FIG. 6 is a partial cross-sectional view of an embodiment of an electronic assembly illustrating an airflow outlet.

Referring to the cross-sectional view of FIG. 6, the airflow outlet 228 is positioned in an outlet body 234 protruding from the side portion 220. The outlet body 234 includes a body housing 236 that defines an outlet plenum 238 unto which the exhaust airflow 262 from the cooling pathways 124 (shown in FIG. 4) is received. A fan cavity 240 is connected to the outlet plenum 238 and the fan 230 is positioned in the fan cavity 240. The fan 230 rotates about a fan axis 242, which in some embodiments is positioned perpendicular to a planar outlet opening 244 of the airflow outlet 228. A grate or screen 260 may be positioned at the airflow outlet 228 to aid in preventing the entry of debris into the interior of the enclosure 212. Additionally the downward facing airflow outlet 228 eliminates the need for additional protection of the cooling pathways 124, via filters or the like, thus reducing cost and weight and improving cooling performance. In addition to preventing impingement of debris into the airflow outlets 228, the downward facing airflow outlet 228 provides a drainage path out of the enclosure 212 for any water or other debris that may enter the enclosure 212.

Figure 7:
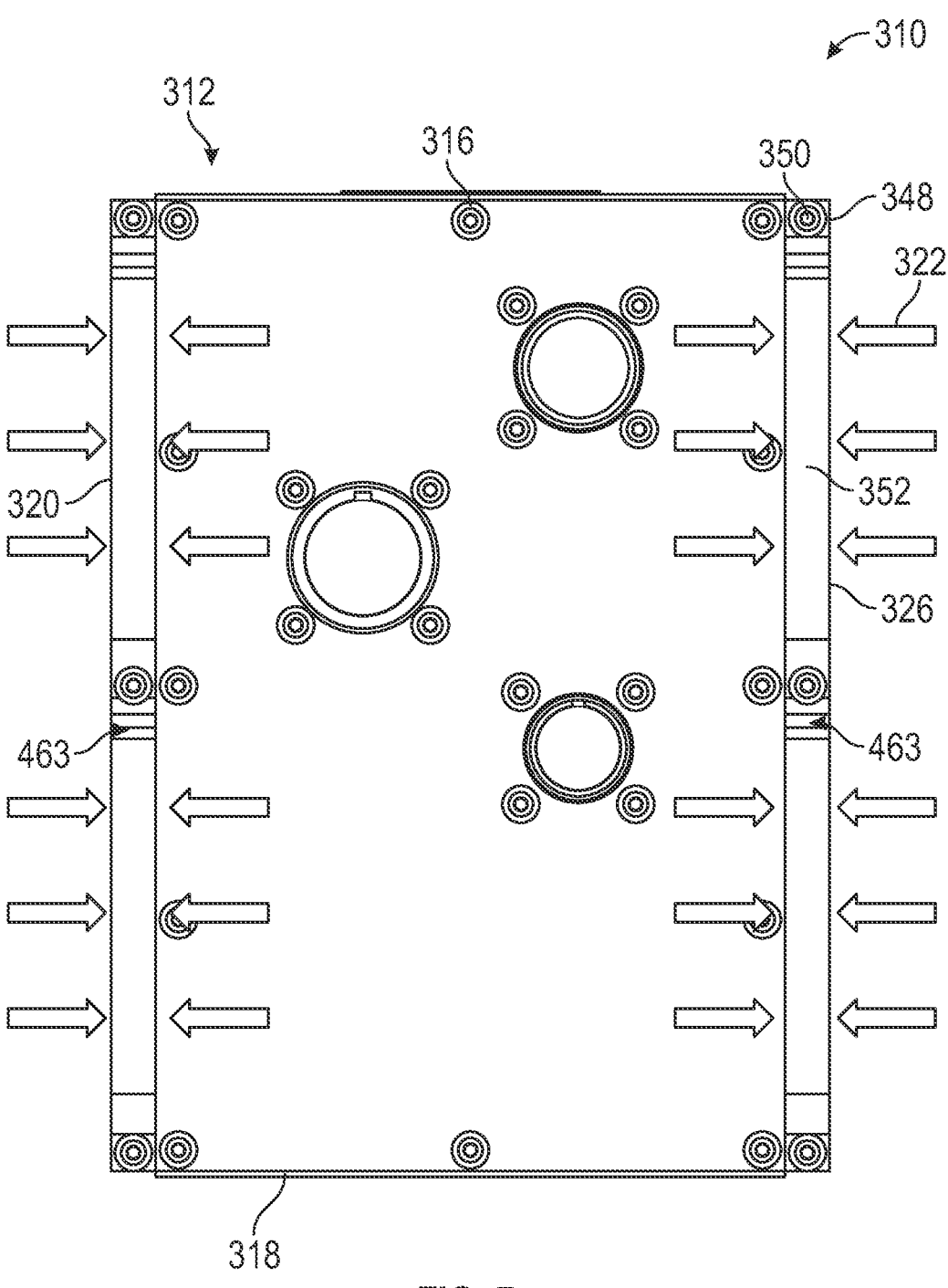
FIG. 7 is a perspective illustration of an embodiment of an electronic assembly including removable covers over the air inlets.
Figure 8:
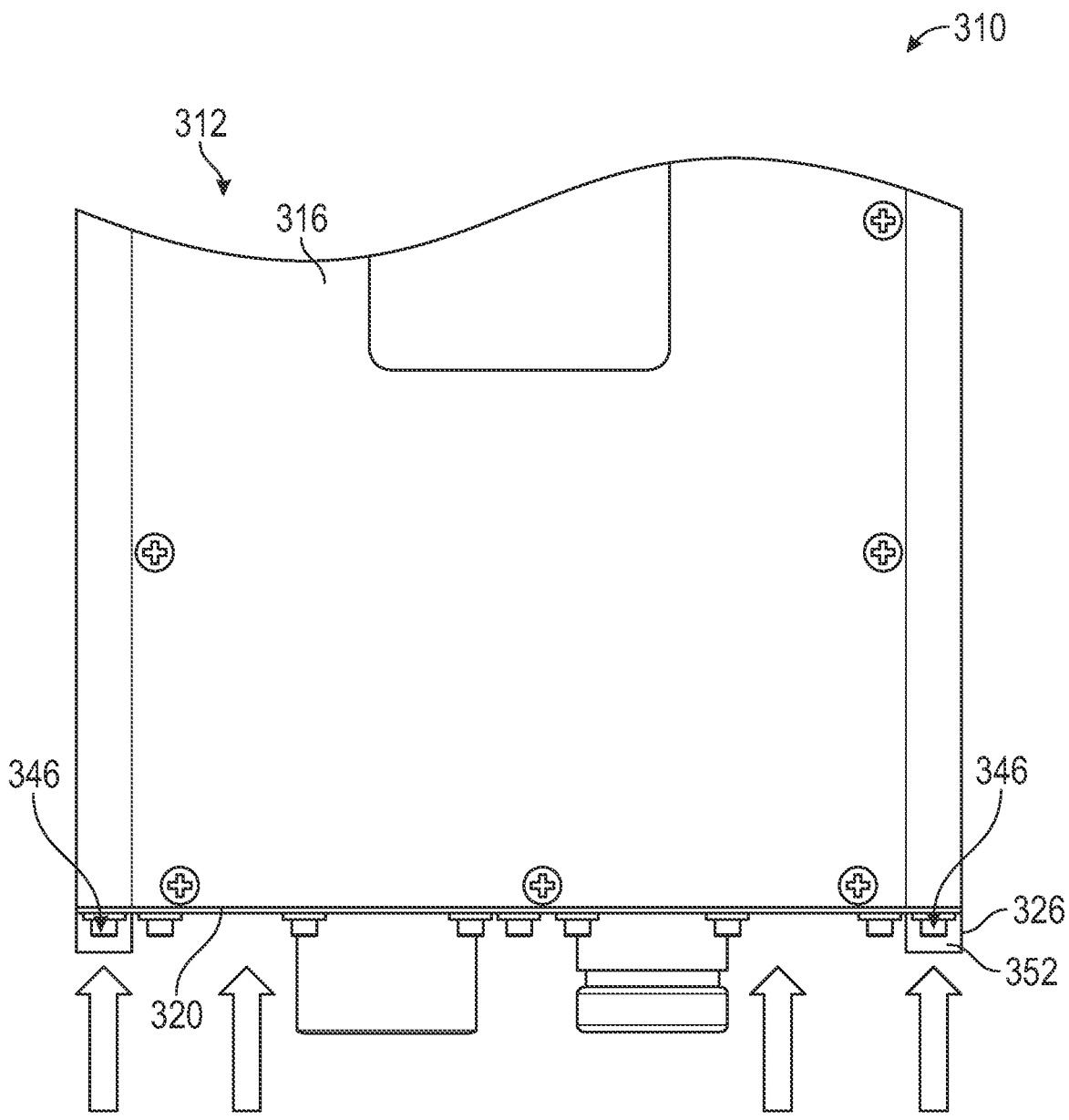
FIG. 8 is another perspective view of an embodiment of an electronic assembly including removable covers over the air inlets.
Figure 9:
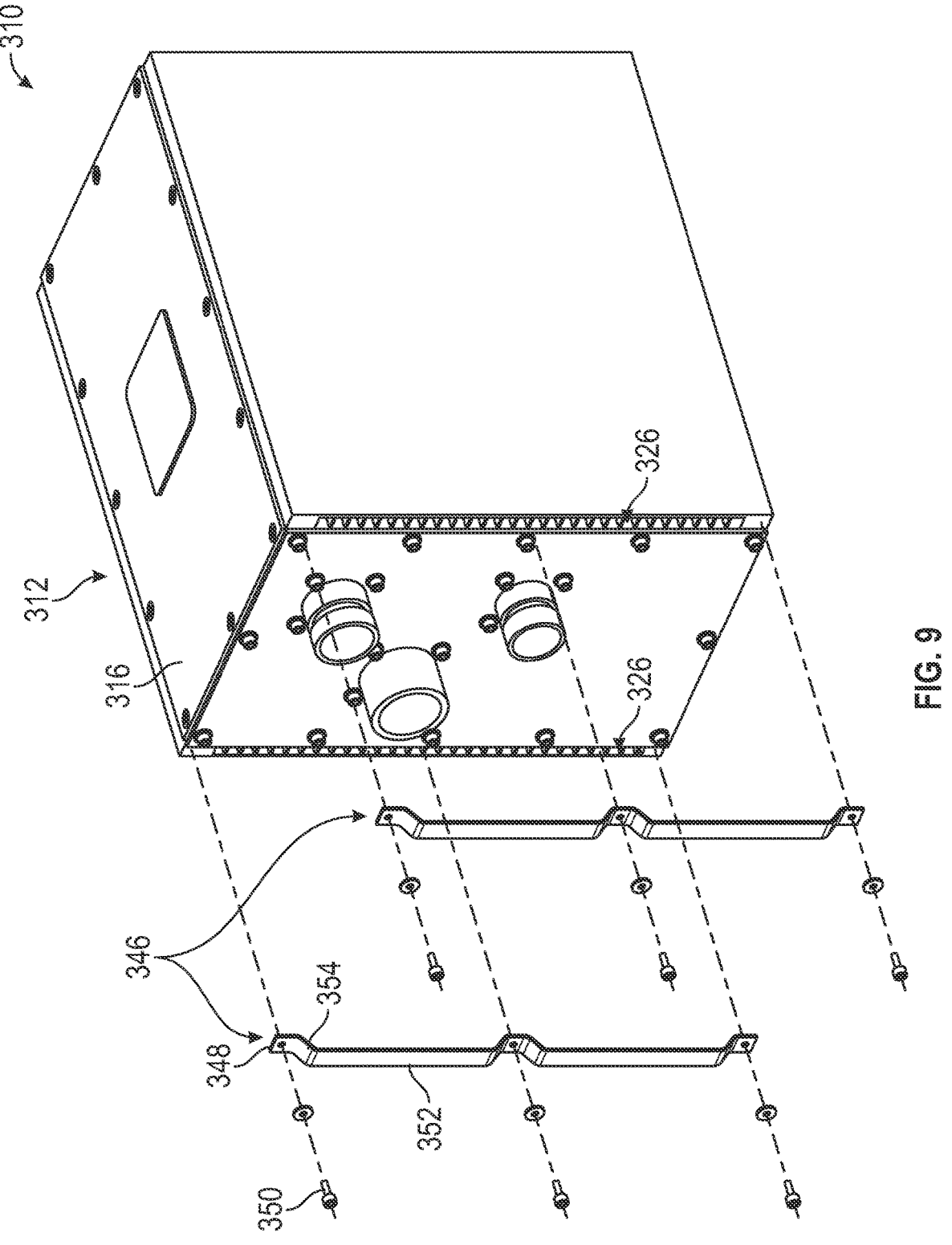
FIG. 9 is a partially disassembled view of an embodiment of an electronic assembly including removable covers over the air inlets.

In another embodiment of enclosure 312, illustrated in FIG. 7-9, the airflow inlets 326 for the airflow 322 are located on the side portion 320 between the top surface 316 and the bottom surface 318, and face outwardly from the side portion 320. One or more removable covers 463 are positioned outwardly from the airflow inlets 326. The covers 463 include an attachment portion 348 at which the covers 463 are secured to the side portion 320 by, for example, one or more screws 350. A cover portion 352 extends from the attachment portion 348. The cover portion 352 is configured to be spaced apart from the airflow inlet 326 by, for example 1 millimeter to 5 millimeters, when the cover 463 is installed to the side portion 320. In some embodiments a cover bend 354 defines the spacing between the airflow inlet 326 and the cover portion 352. When installed, the cover 463 prevents direct impingement of debris onto or into the airflow inlet 326. Additionally the covers 346 eliminates the need for additional protection of the cooling pathways 124 (shown in FIG. 2), via filters or the like, thus reducing cost and weight and improving cooling performance. In addition, the covers 463 are readily removable for use of the electronic assembly 310 in applications where such covers 463 may not be needed.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic assembly, comprising:
one or more electronic components;
an enclosure in which the one or more electronic components are disposed, the enclosure including:
   a vertically top surface;
   a vertically bottom surface; and
   a plurality of side portions extending between the top surface and the bottom surface; and
a cooling arrangement for thermal management of the one or more electronic components, the cooling arrangement including:
   a cooling airflow inlet to admit a cooling airflow into the enclosure;
   a cooling airflow outlet to exhaust the cooling airflow from the enclosure; and
   one or more cooling pathways between the cooling airflow inlet and the cooling airflow outlet;
   wherein the cooling airflow outlet is downward facing toward the vertically bottom surface such that the cooling airflow flows out of the cooling airflow outlet a downward direction toward the vertically bottom surface; and
   a fan disposed at the cooling airflow outlet to urge the airflow through the electronic enclosure out of the cooling airflow outlet;
   wherein the cooling airflow inlet is located on at least one of the plurality of side portions;
   wherein the enclosure includes a removable cover on said at least one of the plurality of side portions to define said cooling airflow inlet such that the cooling airflow flows into the cooling airflow inlet in a direction parallel to the at least one of the plurality of side portions;
   wherein the removable cover includes:
      at least two attachment portions at which the removable cover is secured to the enclosure;
      at least two cover portions spaced apart from the airflow inlet, the at least two attachment portions and the at least two cover portions alternatingly arranged along the removable cover; and
      a plurality of bend portions, each bend portion connecting a cover portion of the at least two cover portions to an adjacent attachment portion of the at least two attachment portions, the bend portion defining a spacing between the cover portion and the airflow inlet.

2. The electronic assembly of claim 1, wherein the fan is positioned in an outlet duct.

3. The electronic assembly of claim 1, wherein the fan rotates about a fan axis arranged parallel to the downward direction.

4. The electronic assembly of claim 1, further comprising an outlet plenum disposed at the cooling airflow outlet upstream of the fan.

5. The electronic assembly of claim 1, further comprising one of a grate or screen disposed at the cooling airflow outlet.

6. The electronic assembly of claim 1, wherein the cooling airflow inlet is downward facing toward the vertically bottom surface such that the cooling airflow flows into the cooling airflow inlet an upward direction toward the vertically top surface.

7. The electronic assembly of claim 1, wherein the cooling airflow inlet is disposed at a side portion of the plurality of side portions.

8. The electronic assembly of claim 1, wherein the cooling airflow inlet is one or more of rectangular, circular, oval, or other geometric shape.

9. The electronic assembly of claim 1, wherein the cooling airflow outlet is configured as a drainage path for the electronic assembly.

10. An electronic enclosure, comprising:
   a vertically top surface;
   a vertically bottom surface;
   a plurality of side portions extending between the top surface and the bottom surface; and
   a cooling airflow inlet to admit a cooling airflow into the enclosure;
   a cooling airflow outlet to exhaust the cooling airflow from the enclosure;
      wherein the cooling airflow outlet is downward facing toward the vertically bottom surface such that the cooling airflow flows out of the cooling airflow outlet a downward direction toward the vertically bottom surface; and
      a fan disposed at the cooling airflow outlet to urge the airflow through the electronic enclosure out of the cooling airflow outlet;
      wherein the cooling airflow inlet is located on at least one of the plurality of side portions;
      wherein the enclosure includes a removable cover on said at least one of the plurality of side portions to define said cooling airflow inlet such that the cooling airflow flows into the cooling airflow inlet in a direction parallel to the at least one of the plurality of side portions;
   wherein the removable cover includes:
      at least two attachment portions at which the removable cover is secured to the enclosure;
      at least two cover portions spaced apart from the airflow inlet, the at least two attachment portions and the at least two cover portions alternatingly arranged along the removable cover; and
      a plurality of bend portions, each bend portion connecting a cover portion of the at least two cover portions to an adjacent attachment portion of the at least two attachment portions, the bend portion defining a spacing between the cover portion and the airflow inlet.

11. The electronic enclosure of claim 10, wherein the fan is positioned in an outlet duct.

12. The electronic enclosure of claim 10, wherein the fan rotates about a fan axis arranged parallel to the downward direction.

13. The electronic enclosure of claim 10, further comprising an outlet plenum disposed at the cooling airflow outlet upstream of the fan.

14. The electronic enclosure of claim 10, further comprising one of a grate or screen disposed at the cooling airflow outlet.

15. The electronic enclosure of claim 10, wherein the cooling airflow inlet is downward facing toward the vertically bottom surface such that the cooling airflow flows into the cooling airflow inlet an upward direction toward the vertically top surface.

16. The electronic enclosure of claim 10 wherein the cooling airflow inlet is disposed at a side portion of the plurality of side portions.

17. The electronic enclosure of claim 10, wherein the cooling airflow inlet is one or more of rectangular, circular, oval, or other geometric shape.

18. The electronic enclosure of claim 10, wherein the cooling airflow outlet is configured as a drainage path for the electronic assembly.

\* \* \* \* \*